United States Patent [19]

Noda et al.

[11] Patent Number: 4,894,692
[45] Date of Patent: Jan. 16, 1990

[54] MESFET WITH ALPHA PARTICLE PROTECTION

[75] Inventors: Minoru Noda; Noriyuki Tanino, both of Itami, Japan

[73] Assignee: Mitsubishi Denki Kabushiki Kaisha, Japan

[21] Appl. No.: 203,295

[22] Filed: Jun. 2, 1988

[30] Foreign Application Priority Data

Jun. 3, 1987 [JP] Japan .................................. 62-139171

[51] Int. Cl.⁴ ............................................ H01L 27/02
[52] U.S. Cl. .................................... 357/23.2; 357/41; 357/22
[58] Field of Search ................. 357/41, 42, 23.5, 23.6, 357/22 J, 23.2, 23.7

[56] References Cited

U.S. PATENT DOCUMENTS

| | | | |
|---|---|---|---|
| 3,886,583 | 5/1975 | Wang | 357/23 |
| 4,377,756 | 3/1983 | Yoshihara et al. | 307/296 R |

FOREIGN PATENT DOCUMENTS

| | | | |
|---|---|---|---|
| 0012889 | 7/1980 | European Pat. Off. | |
| 0203516 | 12/1986 | European Pat. Off. | |
| 3642595 | 6/1987 | Fed. Rep. of Germany | 357/23.6 |
| 54-156484 | 12/1979 | Japan | 357/23.2 |
| 62-71278 | 4/1987 | Japan | |
| 52-214672 | 9/1987 | Japan | |
| 62-214672 | 9/1987 | Japan | |
| 62-219671 | 9/1987 | Japan | 357/23.2 |
| 1497626 | 1/1978 | United Kingdom | |
| 2036431 | 6/1980 | United Kingdom | |
| 2165091 | 8/1986 | United Kingdom | |
| 2183091 | 5/1987 | United Kingdom | |

*Primary Examiner*—William Mintel
*Attorney, Agent, or Firm*—Leydig, Voit & Mayer

[57] ABSTRACT

An integrated circuit includes a semi-insulating semiconductor substrate; a first conductivity type high dopant concentration buried layer produced in the semi-insulating substrate; second conductivity type high dopant concentration drain and source regions produced at the surface of the semi-insulating substrate; a gate electrode produced on the surface of the semi-insulating substrate at a position between the drain and source regions; a second conductivity type channel layer produced between the drain and source regions; and a first conductivity type low dopant concentration region produced only below the second conductivity type channel layer between the second conductivity type drain and source regions in the first conductivity type high dopant concentration region; the drain and source regions being completely surrounded by the first conductivity type high dopant concentration buried layer from the bottom and outer side surfaces thereof. Alternatively, a first conductivity type high dopant concentration buried layer is provided only below and at outer side surfaces of the drain layer and a first conductivity type low dopant concentration buried layer is provided below the channel layer and the source region and at the outer side surface of the source region.

7 Claims, 4 Drawing Sheets

MESFET WITH ALPHA PARTICLE PROTECTION

FIELD OF THE INVENTION

The present invention relates to a semiconductor integrated circuit and, more particularly, to one having an enhanced antisoft error property.

BACKGROUND OF THE INVENTION

Conventionally, in producing a semiconductor integrated circuit on a semi-insulating compound semiconductor substrate such as GaAs, active elements and passive elements which constitute an integrated circuit are produced directly on the semi-insulating compound semiconductor substrate.

FIG. 3 shows such a conventional integrated circuit utilizing a semi-insulating compound semiconductor substrate. In FIG. 3, a MESFET 3 as an active element and a resistor 4 as a passive element are formed by ion implantation directly in a semi-insulating GaAs substrate 1. Reference numerals 5, 6, and 7 designate a gate electrode, a source electrode, and a drain electrode, respectively. Reference numeral 9 designates an n type layer and reference numeral 10 designates an n+ type layer, both produced in the GaAs substrate 1. The MESFET 3 comprises these layers and electrodes. Reference numeral 8 designates an ohmic electrode and reference numeral 11 designates an n type resistor layer which is produced in the GaAs substrate 1. The resistor 4 comprises this layer 11 and these electrodes 8.

In such a conventional integrated circuit structure, an advantage of employing the semi-insulating GaAs substrate 1 is effectively utilized, that is, there is no need to pay special attention to electrical isolation between elements because the semi-insulating GaAs substrate automatically isolates the elements, simplifying element structure and circuit construction.

In such a conventional integrated circuit where the insulating property of the substate 1 is used to isolate elements, reduction of the separation between elements or between element constituting portions to increase the degree of integration increases the leakage current inside the GaAs substrate 1, adversely affecting element and circuit characteristics.

FIG. 4 shows a device in which the leakage current of an FET produced in a p type semi-insulating GaAs substrate is suppressed. This device is disclosed in Japanese Published Patent Application No. 62-71278.

In FIG. 4, the same reference numerals designate the same or corresponding elements as those shown in FIG. 3.

A GaAs layer 2 including p type dopants has a thickness in substrate 1 that is deeper than the depth of the integrated circuit elements subsequently formed in it. Active elements, for example, a MESFET 3 which has an n type layer 9 and operates with n type carriers as majority carriers, are produced on the p type GaAs layer 2.

In this device, the bulk is effectively completely constituted by the p type layer 2. The potential of the p type layer 2 is $V_{psub} \leq 0$, so that the potential barrier between n and p type layers and that between n+ and p type layers is increased and the substrate leakage current is reduced. At the same time, the inter-element n+-p-n+ type parasitic transistor is turned off and inter-element isolation is realized. Thus, the substrate leakage current is reduced by voltage control of the p type substrate, as described in the patent publication.

In the device of FIG. 4, however, it is doubtful that the element isolation would really be completely successful because the semi-insulating property of the GaAs substrate is not utilized for element separation. Parasitic capacitances are likely to be produced at many places. Accordingly, the speed of operation is likely to be reduced.

FIG. 5 shows a device in which, in order to solve the above-described problem, a p type buried layer is selectively produced on the surface of a semi-insulating GaAs substrate. That device is disclosed in FIG. 5 of Japanese Published Patent Application No. 62-214672. In FIG. 5, reference numeral 21 designates a semi-insulating GaAs substrate, reference numeral 22 designates an n type active layer, reference numeral 23 designates source and drain electrodes, reference numeral 24 designates a gate electrode, reference numerals 25 and 26 designate n type high dopant concentration (n+ type) drain and source layers (herein either may be a drain layer), and reference numeral 27 designates a p type buried layer.

In this device, since the p type layer 27 is produced selectively in the semi-insulating GaAs substrate 21 and is surrounded by the GaAs substrate 21, element isolation is completely achieved and the operation speed is not reduced.

The device of FIG. 5, however, is susceptible to soft error. The cause of soft error according to the patent publication is the generation of electron-hole pairs along the paths of incident alpha rays. In the thermal equilibrium, the number of generated holes and electrons are equal to each other. However, since the p type buried layer 27 is completely depleted, an electric field exists in the substrate directly below the channel layer. The generated holes drift toward the source side and the electrons toward the drain side. Since the mobility of electrons is higher than that of holes by more than ten times, where the mobility determines the drifting speed, holes remain in the substrate even after electrons are all collected at the drain. Accordingly, the potential at one side of the substrate is lowered and electrons are injected from the source to the substrate, producing a current flow through a current path other than the original current path. This current is observed because of a carrier amplification effect which occurs upon the incidence of alpha rays.

FIGS. 6 and 7 show devices which are disclosed in FIGS. 1 and 2 of Japanese Published Patent Application No. 62-214672, respectively. In FIG. 6, the same reference numerals designate the same or corresponding elements as those shown in FIG. 5. Reference numeral 28 designates a p type high dopant concentration (p+ type) buried layer and reference numeral 27 designates a p type low dopant concentration (p− type) layer. In FIG. 7, reference numeral 29 designates a control electrode.

In the devices shown in FIGS. 6 and 7, soft errors are said to be suppressed by the following mechanism. When only holes remain in the substrate as described above, it is possible to prevent the lowering of the potential at one side of the substrate due to holes in the neutral region (non-depleted layer) in the p+ type buried layer 28 and to prevent soft error. In the structure of FIG. 7, a control electrode 29 is provided in contact with a p+ type buried layer 28 to control the voltage of the p+ type buried layer 28. The remaining holes all flow out through the control electrode 29, improving the prevention of soft errors.

Thus, in the device of FIGS. 6 and 7, a p+ type buried layer 28 is provided to increase the potential barrier between the n channel layer 20 and the p+ type buried layer, thereby enhancing the anti-soft suppression error property. Further, a p− type layer 27 is provided between the n channel layer and the p+ type buried layer to lower the gate parasitic capacitance which otherwise reduces the operation speed.

In the devices shown in FIGS. 6 and 7, however, there are limitations in the improvement in the anti-soft error property because the drain layer is not completely surrounded by a p− type layer 27 and the p+ type layer 28. In Japanese Published Patent Application No. 62-214672, it is not explicitly stated that the layer 25 is a drain layer. Electrons generated in the region of the GaAs substrate 21 due to incidence of alpha rays may flow into the n+ type drain layer 26 as shown in FIG. 7(b).

SUMMARY OF THE INVENTION

An object of the present invention is to provide a semiconductor integrated circuit, such as a GaAs integrated circuit having an improved anti-soft error property.

According to an aspect of the present invention, there is provided a semiconductor integrated circuit in which a first conductivity type high dopant concentration buried layer is produced in a semi-insulating substrate, a second conductivity type high dopant concentration drain and source regions and a second conductivity type channel layer disposed therebetween are produced at surface regions of the semi-insulating semiconductor substrate in the first conductivity type high dopant concentration buried layer. The drain and source regions and the channel layer are completely surrounded by the buried layer at the bottom and side surfaces thereof. Accordingly, electrons generated at the region of the semi-insulating substrate due to incidence of alpha rays are prevented from flowing into the drain region and the anti-soft error property is improved.

According to another aspect of the present invention, a first conductivity type high dopant concentration region is produced surrounding the drain region at the bottom and outer side surfaces of the drain region and a first conductivity type low dopant concentration buried layer is produced surrounding the channel layer and the source region from the bottom surfaces thereof and the outer side surfaces of the source region. Accordingly, gate parasitic capacitance is reduced and element properties are greatly improved.

Other objects and advantages of the present invention will become apparent from the detailed description given hereinafter. It should be understood, however, that the detailed description and specific embodiment are given by way of illustration only since various changes and modifications within the spirit and scope of the invention will become apparent to those skilled in the art from this detailed description.

DETAILED DESCRIPTION OF THE PREFERRED EMBODIMENT

Figure 1:
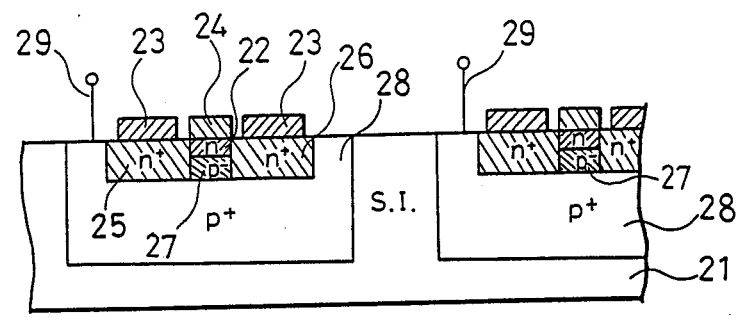
FIG. 1 is a cross-sectional view of a GaAs integrated circuit as a first embodiment of the present invention.

FIG. 1 shows a GaAs integrated circuit device as a first embodiment of the present invention. In FIG. 1, reference numeral 21 designates a semi-insulating GaAs substrate. High dopant concentration p type (p+) buried layers 28 are produced in the surface regions of the semi-insulating GaAs substrate 21, respectively, separated from each other. FET elements, each comprising an n type channel layer 22, n+ type source and drain layers 25 and 26, a gate electrode 24, and source and drain electrodes 23 are produced respectively in each of the p+ type embedded layers 28. A low dopant concentration p type (p−) buried layer 27 is provided directly below the n channel layer 22 between the n+ type drain and source layers 25 and 26 in the p+ type embedded layer 28. A control electrode 29 is provided in contact with the p+ type buried layer 28 to enable controlling the voltage of the p+ type buried layer 28. Herein, the p+ type buried layer 28 is produced so that it would not be completely depleted.

Figure 6:
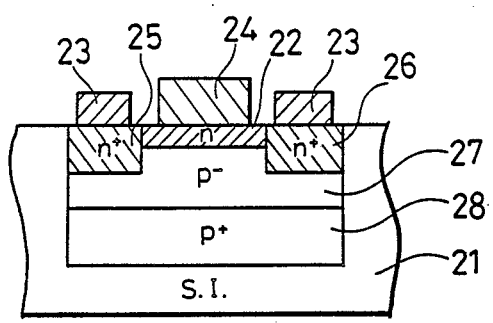
FIGS. 6, 7(a) and 7(b) are cross-sectional views of a third and fourth example of prior art GaAs integrated circuits.
Figure 7:
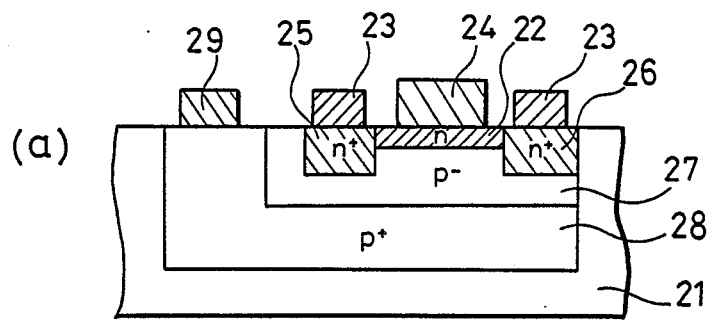
Figure 7:
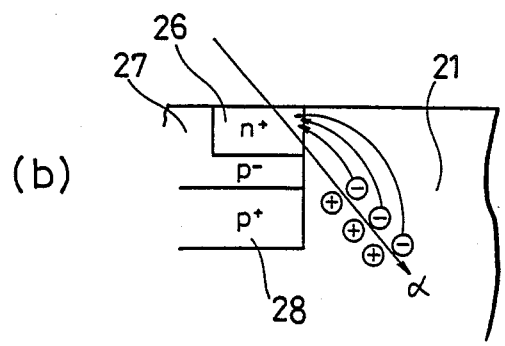

In the device of this first embodiment, since the p+ type embedded layers 28 are selectively produced, inter-element isolation is completely accomplished by the semi-insulating GaAs substrate 21. Furthermore, the n+ type source and drain layers 25 and 26 are completely surrounded by the p+ type embedded layer 28. In addition, the same effects as those of the devices of FIGS. 6 and 7 are achieved as anti-soft properties, and the flowing of electrons generated at the region of the semi-insulating GaAs substrate 21 due to the incidence of alpha rays into the drain region 26 is prevented, greatly improving the anti-soft error properties.

Figure 2:
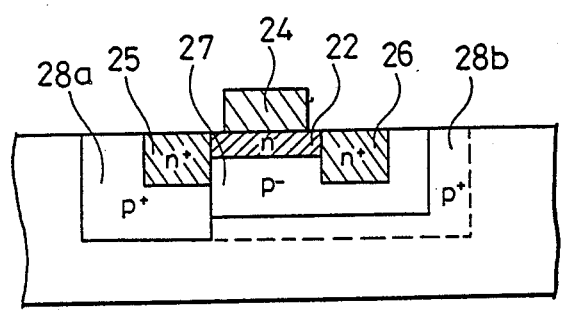
FIG. 2 is a cross-sectional view of a GaAs integrated circuit as a second embodiment of the present invention.
Figure 3:
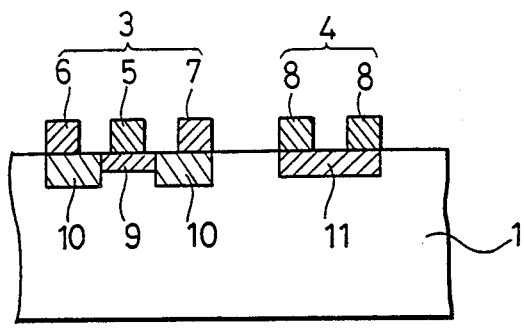
FIG. 3 is a cross-sectional view of a conventional GaAs integrated circuit.
Figure 4:
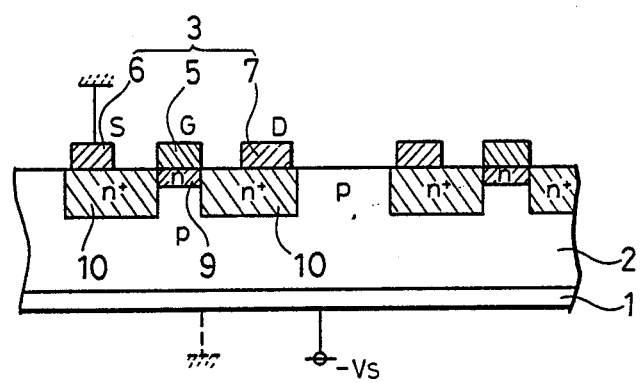
FIGS. 4 and 5 are cross-sectional views of a first and second example of prior art GaAs integrated circuits.
Figure 5:
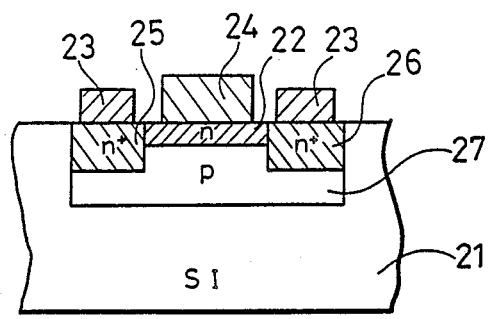

FIG. 2 shows a second embodiment of the present invention. In FIG. 2, the same reference numerals designate the same or corresponding elements as those of FIG. 1. In this second embodiment, a p+ type buried layer 28a is provided below and at the outer sides of the n+ type drain layer 25, a p− type buried layer 27 is provided below the channel layer 22 and below and at the outer side surfaces of the n+ type source region 26. A p+ type buried layer 28b may be provided below and at the outer side surfaces of the p− type buried layer 27.

In the device of the second embodiment, the drain n+ type layer, except for the gate side thereof, is completely surrounded by a high dopant concentration p+ type layer 28. Thus, the drain region is surrounded by the p+ type layer, and the n+-p+ type potential barrier at the boundary of the drain region is higher than the potential barrier of the n+-p− type structure. Accordingly, in addition to having the same anti-soft error properties of the devices of FIG. 6 and 7, the flow of electrons generated in the semi-insulating GaAs substrate 21 due to the incidence of alpha rays on the drain region is prevented and the anti-soft error property is greatly improved. Furthermore, in order to suppress an increase in the gate parasitic capacitance, a p+ type layer is not provided other than below and at the outer side of the drain n+ type layer. For the same reason, it is preferred that the p+ type layer 28b under the p− type layer not be present. Herein, the p type layer is produced so that it would not be completely depleted, although it has to have a low dopant concentration of carriers.

Thus, in the device of this second embodiment, current flow due to the incidence of alpha rays is greatly reduced, the anti-soft error property is greatly improved, and gate parasitic capacitance is largely reduced. Accordingly, quite a high quality element is obtained.

In the illustrated embodiment, GaAs is used for the semiinsulating semiconductor substrate, but InP can also be used for the semi-insulating semiconductor substrate. In this case, the dopants which make the substrate p type or n type are the same as those used when the substrate is GaAs.

As is evident from the foregoing description, according to an aspect of the present invention, since the n+ type source and drain layers are surrounded by a high dopant concentration p+ type layer, the flow of electrons generated due to the incidence of alpha rays on the drain region is prevented by the p+ type high dopant concentration buried layer, and the anti-soft error property of the GaAs integrated circuit is greatly improved. Furthermore, according to another aspect of the present invention, only the drain n+ type layer, except for the gate side thereof, is surrounded by a high dopant concentration p+ type buried layer and the other regions of the FET element are surrounded by a low dopant concentration p− type buried layer. Therefore, the anti-soft error property is improved and the gate parasitic capacitance is greatly reduced, thereby resulting in a high quality element.

What is claimed is:

1. An integrated circuit comprising:
   a semi-insulating semiconductor substrate having a surface;
   a first conductivity type embedded region disposed in said semi-insulating substrate;
   second conductivity type drain and source regions disposed in and at the surface of said semi-insulating substrate;
   a gate electrode disposed on the surface of said semi-insulating substrate between said drain and source regions;
   a second conductivity type channel layer disposed in said substrate and at the surface proximate said gate electrode between said drain and source regions; and
   a first conductivity type buried region disposed in said substrate between and bounded by said channel layer, said drain and source regions, and said embedded region, said drain and source regions being completely surrounded in said substrate by and contiguous with said embedded region wherein said embedded region is heavily doped relative to said buried region and said source and drain regions are heavily doped relative to said channel layer.

2. An integrated circuit as defined in claim 1 wherein said semi-insulating semiconductor substrate comprises GaAs.

3. An integrated circuit as defined in claim 2 wherein said semi-insulating semiconductor substrate comprises InP.

4. An integrated circuit device comprising:
   a semi-insulating semiconductor substrate having a surface;
   second conductivity type drain and source regions disposed in said substrate at the surface of said semi-insulating substrate;
   a gate electrode disposed on the surface of said semi-insulating substrate between said drain and source regions;
   a second conductivity type channel layer disposed in said substrate at the surface proximate said gate electrode between said drain and source regions;
   a first conductivity type embedded layer surrounding said drain region in said substrate except proximate said channel layer; and
   a first conductivity type first buried layer disposed in said substrate surrounding said channel layer and said source region except proximate said drain region wherein said embedded layer is heavily doped relative to said buried layer and said source and drain regions are heavily doped relative to said channel layer.

5. An integrated circuit as defined in claim 4 wherein said semi-insulating semiconductor substrate comprises GaAs.

6. An integrated circuit as defined in claim 4 wherein said semi-insulating semiconductor substrate comprises InP.

7. An integrated circuit as defined in claim 4 including a second first conductivity type buried layer disposed in said substrate surrounding said first buried layer.

* * * * *